United States Patent [19]

Schuft

[11] Patent Number: 5,141,050
[45] Date of Patent: Aug. 25, 1992

[54] CONTROLLED HIGHLY DENSIFIED DIAMOND PACKING OF THERMALLY CONDUCTIVE ELECTRICALLY RESISTIVE CONDUIT

[75] Inventor: Charles F. Schuft, Westford, Mass.

[73] Assignee: Tra-Con, Inc., Medford, Mass.

[21] Appl. No.: 738,596

[22] Filed: Jul. 31, 1991

[51] Int. Cl.⁵ .......................... F28F 7/00; H01L 23/34
[52] U.S. Cl. .................................... 165/185; 524/424
[58] Field of Search ............... 165/185; 252/500, 514; 524/424

[56] References Cited

U.S. PATENT DOCUMENTS

| | | | |
|---|---|---|---|
| 4,602,125 | 7/1986 | West et al. | 174/138 G |
| 4,654,752 | 3/1987 | Daszkowski | 361/388 |
| 4,685,987 | 8/1987 | Fick | 156/247 |
| 4,782,893 | 11/1988 | Thomas | 165/185 |
| 4,838,347 | 6/1989 | Dentini et al. | 165/185 |
| 4,852,646 | 8/1989 | Dittmer et al. | 165/185 |

FOREIGN PATENT DOCUMENTS

0379773A1 8/1990 European Pat. Off.

Primary Examiner—Allen J. Flanigan
Attorney, Agent, or Firm—Weingarten, Schurgin, Gagnebin & Hayes

[57] ABSTRACT

The invention provides a system and method for fabricating an electrically resistive, high density diamond-packed thermal conduit for electrical components. An exemplary conduit provides superior thermal transfer between two objects. This is achieved by establishing, within a flowable and highly shrinkable electrically insulative carrier medium such as acrylic, intimate contact between diamond particles preferably having an aspect ratio of 1.35 or less.

17 Claims, 1 Drawing Sheet

CONTROLLED HIGHLY DENSIFIED DIAMOND PACKING OF THERMALLY CONDUCTIVE ELECTRICALLY RESISTIVE CONDUIT

FIELD OF THE INVENTION

The present invention relates to an electrically insulative thermal conductor, and more Particularly to a densified diamond-packed thermal conduit for use with electrical components.

BACKGROUND OF THE INVENTION

Materials which are thermally conductive yet electrically insulative are needed for applications in electrical circuitry, such as for potting or bonding electrical components to cooling structures or systems. A thermally conductive path may be required, for example, between a semiconductor chip and heat sink; but the path must be electrically nonconductive to prevent shorts. Materials used for this purpose have comprised epoxy resin and fillers such as boron nitride, silver, alumina, and beryllia.

The use of epoxy resin pastes and films having diamond particles is disclosed in European Patent Application Publication Number 0 379 773 A1, filed Apr. 7, 1989. An epoxy resin paste containing 80% by weight diamond filler was compared favorably in terms of thermal conductivity and electrical resistivity to an epoxy containing a silver filler. The resin, 60% by volume of diamond particles, was Tra Con FS 280, sold by TRA-CON, Inc. of Medford, Mass.

Until the present invention, the full benefits of using diamond particles for improved thermal conductivity has not been realized or suggested. It is observed that the thermal conductivity value for a polymer alone (e.g., epoxy with no filler) is about 0.2 (W/m.C); the value for diamond alone is 26 (W/m.C). The EP publication teaches that epoxy containing "81% (by weight) diamond filler" provides an average thermal transfer value of 2.8 (W/m.C) at most. This value is far short of the 26 W/m.C of diamond. Although it was suggested in the EP publication that small diamond particles be used to fill the voids between large particles, the resin-based system disclosed therein did not ostensibly approach the heat transfer performance ideally realizable (26 W/m.C) through the use of neat diamond. This is believed to be due to the low (60%) volume percentage content of diamond. The EP publication does not suggest how to load the final volume fraction, containing about 40% volume of the epoxy resin, with the diamond filler.

SUMMARY OF THE INVENTION

The invention provides a system and method for formulating an electrically resistive, high density diamond-packed thermal conduit for electrical components. An exemplary conduit provides superior thermal conductivity which is achieved by establishing, within a flowable and highly shrinkable electrically insulative carrier medium such as acrylic, intimate contact between diamond particles preferably having an aspect ratio of 1.35 or less.

The aspect ratio of a particle refers to the ratio of the length to the width, and in general it is considered as the particle's closeness to sphericality. It has been discovered that particles previously used (e.g., TRA CON FS-280) have an aspect ratio of about 1.55, and that thermal conductivity may be substantially improved by having an improved aspect ratio. Accordingly, an exemplary conduit uses particles having aspect ratios of 1.35 or less. Diamond loading of the carrier medium in terms of volume percentage as well as flowability and viscosity characteristics of the carrier are greatly improved. As a consequence, the thermal pathway can be reduced such that the resultant contact between and controlled distribution of diamond particles in the carrier medium substantially increases thermal conductivity.

In addition, an exemplary system and method of the invention utilize highly shrinkable polymers, such as acrylic or polyester, to increase intimate contact between and among the densely packed particles and, concommitantly, to effectuate the diamond loading of the final volume fraction of the adhesive material.

DESCRIPTION OF THE DRAWINGS

A complete understanding of the features and advantages of the invention may be more readily obtained by reference to the following detailed description when considered in conjunction with the accompanying drawings wherein.

DETAILED DESCRIPTION OF THE INVENTION

It has been discovered that the thermal conductivity of diamond packed conduit systems can be substantially increased by using diamond particles having an improved aspect ratio. The particles, which may be comprised of natural diamond, synthetic diamond, or a combination of both, are suspended and dispersed within a high-shrinkage flowable carrier material that cures or hardens, typically in situ, to a non-flowable, preferably voidless solid.

Figure 1:
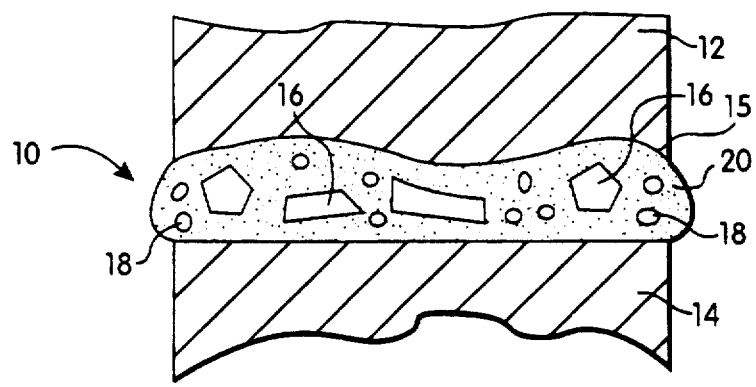
FIG. 1 is a schematic view of an exemplary thermal conduit of the invention comprised of polymerizable carrier material prior to shrinkage and containing diamond particles.
Figure 2:
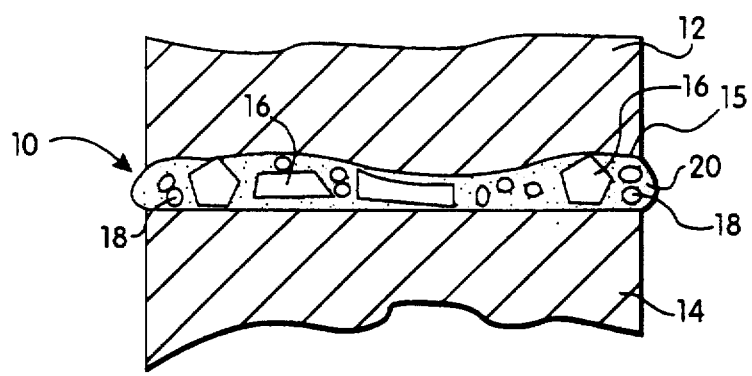
FIG. 2 is a schematic view of the diamond-loaded carrier material of FIG. 1 after shrinkage.

FIG. 1 illustrates an exemplary thermal conduit 10 of the invention comprised of diamond-filled carrier material 20 disposed between a first element 12 and a second element 14. The adhesive material 10 is shown prior to shrinkage. FIG. 2 illustrates the adhesive of FIG. 1 after shrinkage. The material 10 acts as a thermal conduit between elements 12/14 such as a transistor or semiconductor chip 12 and a heat sink or other structure 14.

An exemplary conduit is formed by curing or hardening a carrier material comprised of 70 parts of 25 micron diamond particles 16, preferably pre-cleaned and having a preclassified 1.35 aspect ratio, and 30 parts of a 3 micron diamond particle 18, preferably pre-cleaned and having a preclassified aspect ratio of 1.6 or less. A number of known methods may be used for cleaning the particles of process wetting agents, water soluble ions, organic films, and other contaminants. A number of methods may also be used for sizing the particles and ascertaining their shape factors, such as their average dimensions.

Generally speaking, the aspect ratio is an indication of the closeness of a particle to a "spherical" shape. The aspect ratio may be conceived of as pertaining to the length and thickness of the particle, with the ratio of the ideal spherical shape being 1. It has been discovered that particles 16/18 having improved aspect ratios contribute substantially to increasing the loading of diamond into the carrier 20 in terms of percentage volume. It is believed that the improved aspect ratio or shape factor of the diamond particles avoids inter-particle collisions and drag forces during shearing of the carrier material, and this improves flowability and maintains low viscosity of the carrier 20. Thus, while an uneven edge 15 on one or both of the elements has characteristically impeded thermal conductivity in prior art adhesives, the thermal transfer capacity of the flowable adhesives provided by the present invention is not expected to be significantly diminished. In part, this is believed to be due to improved flow and maintenance of intimate contact, a state afforded by the improved flowability of the conduit 10 (as shown in FIG. 1) in which interspersed particles are sufficiently proximate to each other so as to afford a direct thermal pathway (FIG. 2) across the conduit 10 from one element 12 to the other element 14. The distances between particles 16/18 and the distance as well between elements 12/14 can be optionally decreased, and consequently improved thermal conductivity may be realized in the conduit.

Methods for classification of ground particles such as diamond, to select designated sizes and shapes are known to those skilled in the art. Such methods include the use of screens, air classification, and vibration tables. Analytical tools for measuring the size and shapes of particles are also available, including optical methods such as microscopy and light scattering, as well as methods employing electricity and solutions. Thus, selected particle sizes and shapes can be collected and measured for use in the present invention by a variety of known methods.

An exemplary carrier material comprises 20 parts of an acrylic resin, such as Weldon 40A available from IPS, Inc. of Gardena, Calif., and 1.2 parts of acrylic catalyst, such as Weldon 40B, also available from IPS, Inc. In contrast to the epoxy resins described in the EP publication (0 379 733 A1) which are known for their low shrinkage, the carriers used in the present invention have shrinkage values as high as 10-20% or more by volume during polymerization. This substantially increases the volume fraction of the diamond packing. It is expected that a slight volume fraction increase in diamond packing, even a 1 or 2 percent increase, renders significant improvement in thermal conductivity, and the improvement in thermal transfer ability is expected to be reflected exponentially rather than linearly in proportion to the increase in diamond percentage volume. Silicones, polyimides, resinous materials, heat-shrink plastics and other compounds and combinations of such compounds may be used which are capable of being polymerized or reduced in volume in situ.

The size of the diamond particles may be varied in the carrier material in accordance with the application. It is envisaged that the large particles 16, if indeed their shape factors are controlled to the extent contemplated by the invention, may be sized to be equal or slightly less than the "bond line" or thickness of the conduit 10 in its cured state. Ideally, the particles 16 may be sized such that a thermal shunt is achieved whereby a direct thermal transfer path is achieved in an object-conduit-object interface when the carrier material 20 is in its shrunken state.

The conduit 10 may function in concert with the properties of the continuous phase polymer 20, and thereby may be flexible or rigid, permanent or removable, high or low cohesive and/or adhesive strength, as well as being a conduit between metals, ceramics, plastics, or any combination of organic or inorganic materials. Any method known for removing extraneous gases and occluded and/or entrained voids from the polymeric material 18 may be used. The conduit should contain little or no void space, and void volume less than 10% is preferable.

Smaller particles 18 may be interspersed among larger particles 16 and, in addition to comprising diamond, may comprise silica (e.g., Cab-O-Sil, a trademark of Cabot Corporation), lithium aluminum silicate (e.g., Lithafrax, a trademark of Pakco), ceramic spheres (e.g., glass beads available from Potters), submicron alumina (e.g., fumed alumina available from Degussa), and other thermally conductive materials.

As modifications and variations of the embodiments discussed herein will be evident to those skilled in the art, the scope of the invention is limited only by the scope of the following claims.

I claim:

1. A method for controlled highly densified diamond packing of an electrically resistive, thermally conductive conduit, comprising the steps of:
   providing diamond particles having a predetermined aspect ratio, at least a portion of said diamond particles having an aspect ratio less than 1.55;
   dispersing said particles within an electrically resistive highly shrinkable carrier material when said carrier is in a flowable state; and
   shrinking said carrier material containing said diamond particles.

2. The method of claim 1 wherein said portion of said diamond particles having an aspect ratio less than 1.55 comprises substantially all of said diamond particles.

3. The method of claim 1 wherein said diamond particles have and aspect ratio of 1.35 or less.

4. The method of claim 1 wherein said diamond particles are comprised of 70 parts of 25 micron diamond particles, pre-cleaned and having a screened 1.35 aspect ratio, and 30 parts of a 3 micron diamond particle, pre-cleaned and having a screened aspect ratio of 1.6 or less.

5. The method of claim 1 wherein said carrier material is flowable in a continuous state prior to shrinkage.

6. The method of claim 1 wherein said carrier material has a shrinkage factor of at least 5 percent.

7. The method of claim 1 wherein said carrier material has a shrinkage factor of at least 10 percent.

8. The method of claim 1 further comprising the steps of applying said carrier material containing said diamond particles in a flowable form between two objects and shrinking said carrier material.

9. The method of claim 1 wherein said conduit contains less than 10 percent void volume in its final form.

10. The method of claim 1 wherein, prior to said step of shrinking said carrier material, said carrier material containing said diamond particles is freely flowable to permit intimate contact of said particles with elements surrounding said conduit.

11. The method of claim 1 wherein said carrier material is curable in situ through the application of heat.

12. The method of claim 1 wherein said carrier material is curable in situ through the application of a catalyst.

13. An electrically resistive, highly densified diamond packed conduit having high thermal conductivity, comprising:

an electrically resistive highly shrinkable material packed with diamond particles having a predetermined aspect ratio, at least a portion of said diamond particles having an aspect ratio less than 1.55, said diamond particles being dispersed throughout said carrier material when said carrier material is in a flowable state, and said diamond particles being in intimate contact with other particles within said carrier material, said carrier material being shrinkable by at least 5 percent in volume and having a void volume when in a shrunken state of less than 10%.

14. The conduit of claim 13 wherein said diamond particles are comprised of large particles and said carrier material is further packed with small particles, and said small particles are selected from the group consisting of diamond, silica, lithium aluminum silicate, ceramic, glass, and alumina.

15. The conduit of claim 13 wherein said diamond particles are packed in said conduit in excess of 60% volume when said material is in a shrunken state.

16. The conduit of claim 13 wherein said diamond particles are comprised of large and small particles, said large particles having an aspect ratio of 1.35 or less.

17. An electrically resistive, highly densified diamond packed conduit having high thermal conductivity, comprising:

an electrically resistive highly shrinkable carrier material packed with large and small particles, the large particles comprising diamond particles having a predetermined aspect ratio, the small particles being selected from the group consisting of silica, lithium aluminum silicate, ceramic, glass, and alumina, said particles being dispersed throughout said carrier material when said carrier material is in a flowable state, and said particles being in intimate contact with other particles within said carrier material, said carrier material being shrinkable by at least 5 percent in volume and having a void volume when in a shrunken state of less than 10 percent.

* * * * *